(12) United States Patent
Cove

(10) Patent No.: US 6,784,749 B1
(45) Date of Patent: Aug. 31, 2004

(54) LIMITING AMPLIFIER WITH ACTIVE INDUCTOR

(75) Inventor: Stephen E. Cove, Cameron Park, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/321,222

(22) Filed: Feb. 24, 2003

(51) Int. Cl.[7] .............................. H03F 3/08; H03F 3/45
(52) U.S. Cl. ...................................... 330/308; 330/253
(58) Field of Search ................................ 330/252, 253, 330/308; 327/309; 333/214

(56) References Cited

U.S. PATENT DOCUMENTS 6,658,217 B2 * 12/2003 Ohhata et al. ............... 398/202
6,665,498 B1 * 12/2003 Jiang et al. .................. 398/135
2004/0036534 A1 * 2/2004 Gupta et al. ................. 330/260

* cited by examiner

*Primary Examiner*—Steven J. Mottola
(74) *Attorney, Agent, or Firm*—Buckley, Maschoff & Talwalkar LLC

(57) ABSTRACT

According to some embodiments, a circuit includes a limiting amplifier, the limiting amplifier including an output node. The circuit also includes an active inductor coupled to the output node, and may exhibit a zero approximately at a frequency at which the active inductor begins to exhibit substantially inductive characteristics.

10 Claims, 5 Drawing Sheets

LIMITING AMPLIFIER WITH ACTIVE INDUCTOR

BACKGROUND

Amplifiers can be generally classified as operational amplifiers or limiting amplifiers. An operational amplifier receives an input signal and generates a signal that has an amplitude different from the amplitude of the input signal. The frequency components of the generated signal are substantially identical to the frequency components of the input signal.

In contrast, a limiting amplifier receives an input signal and generates a signal having a specified peak-to-peak amplitude. The specified amplitude is identical for any input signal that is within the operating range of the limiting amplifier. In a limiting amplifier, the frequency components of the output signal may differ from the frequency components of the input signal.

Some applications require an amplifier to provide a particular gain over a particular bandwidth. In the case of a limiting amplifier, the particular gain may be represented by a minimum input signal that must be amplified to a specific peak-to-peak amplitude over the particular bandwidth. A conventional limiting amplifier is unable to suitably satisfy these requirements for some existing applications. One such application is described in the OC-192 10Gb/s optical signaling specification.

Conventional limiting amplifiers may present other drawbacks. A conventional limiting amplifier consumes significant die space when fabricated as an integrated circuit. Moreover, the gain provided by some existing limiting amplifiers varies unacceptably with process.

DETAILED DESCRIPTION

Figure 1A:
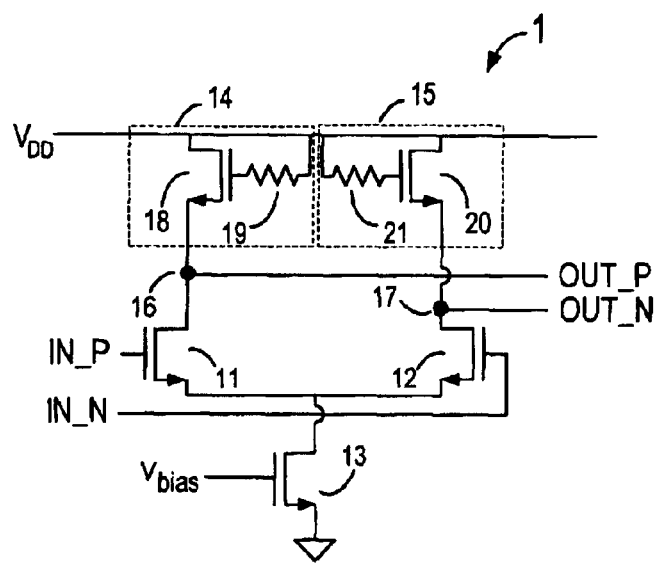
FIG. 1a is a diagram of a limiting amplifier according to some embodiments.

FIG. 1a illustrates limiting amplifier 1 according to some embodiments. Limiting amplifier 1 receives two input signals, each of which is a component of a differential input signal, and generates two output signals, each of which is a component of a differential output signal. The input signals are present on the signal lines labeled $IN_{13}P$ and $IN_{13}N$ in FIG. 1. Similarly, the output signals are provided by the signal lines labeled $OUT_{13}N$ and $OUT_{13}P$.

As shown, the input signals are applied to gates of n-channel metal-oxide semiconductor (NMOS) transistors 11 and 12. Sources of transistors 11 and 12 are coupled to one another, and are also coupled to a drain of NMOS transistor 13. A source of transistor 13 is coupled to ground, and a gate of transistor 13 receives bias voltage $V_{bias}$. Transistor 13 thereby provides a current source to limiting amplifier 1.

Active inductors 14 and 15 are coupled to a gain stage of limiting amplifier 1. In particular, active inductor 14 is coupled to output node 16 and active inductor 15 is coupled to output node 17. Active inductor 14 includes NMOS transistor 18 and resistor 19. A drain of transistor 18 is coupled to a supply voltage, and a source of transistor 18 is coupled to output node 16. A gate of transistor 18 is coupled to a first contact point of resistor 19, and a second contact point of resistor 19 is coupled to the supply voltage. Active inductor 15 is configured similarly to active inductor 14. Active inductor 15 therefore includes NMOS transistor 20 and resistor 21, with a drain of transistor 20 coupled to the supply voltage, and a source coupled to output node 17. A first contact point of resistor 21 is coupled to a gate of transistor 20, and a second contact point of resistor 21 is coupled to the supply voltage. According to some embodiments, any other type of currently- or hereafter-known active inductors may be substituted for one or both of active inductors 14 and 15.

Figure 1B:
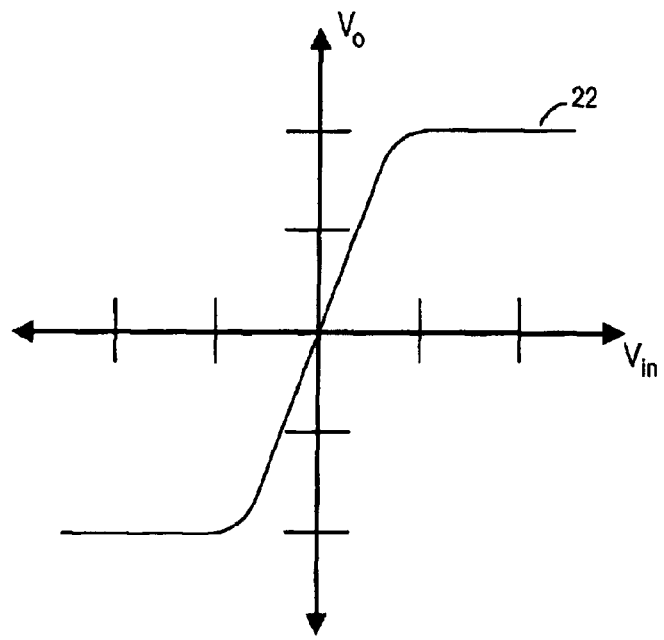
FIG. 1b is a plot of a gain function of an amplifier according to some embodiments.

FIG. 1b shows gain function 22 of limiting amplifier 1. Function 22 reflects the theoretical gain of limiting amplifier 1, or $V_0 = V_{in}(g_m Z_l)$, where $V_{in} = IN_{13}P - IN_{13}N$ and $V_0 = OUT_{13}P - OUT_{13}N$. Actual values represented by gain function 22 depend upon the specific components used in limiting amplifier as well as the value of $V_{bias}$. As shown, values of $V_0$ are limited to a particular value for all values of $V_{in}$ that are greater than a certain value. The operating range of limiting amplifier 1 therefore includes $V_{in}$ values that are greater than the certain value. For $V_{in}$ values that are less than the certain value, limiting amplifier 1 provides linear amplification such as that described in the above Background section.

In some embodiments, active inductors 14 and 15 increase the bandwidth of limiting amplifier 1 over traditional limiting amplifier arrangements that include resistive loads, and consume less die space than passive inductors. Values of resistors 19 and 21 may be determined so as to set a zero at a frequency at which the transistor source impedance of their respective inductor begins to exhibit substantially inductive characteristics. For example, an impedance looking into the source of active inductor 14 is determined by $R(j2\pi f + 1/RC_{gs})/(j2\pi f + g_m/C_{gs})$. Some embodiments may thereby provide an inductive peak to a frequency response of limiting amplifier 1 at or before a frequency that would otherwise reflect the −3 dB bandwidth of amplifier 1. Such embodiments may allow for more stages of amplification and therefore smaller input signals than current limiting amplifiers, while maintaining bandwidth required by a particular application.

Any type of currently- or hereafter-known active inductors may be used in conjunction with some embodiments. An active device is a device that requires a source of energy for its operation. An inductor is a device characterized by the relationship $Z = j2\pi f L$. Accordingly, an active inductor is a device that requires a source of energy for its operation and that substantially exhibits characteristics governed by $Z = j2\pi f L$ over some frequency range. These characteristics need not be exhibited over all frequency ranges.

Figure 2C:
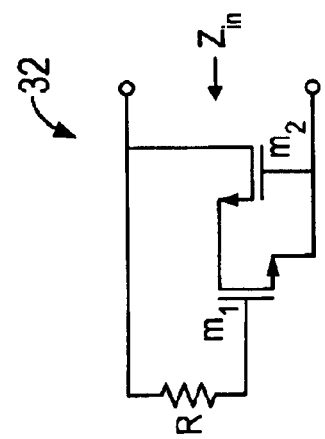
FIGS. 2a through 2c comprise diagrams of active inductors according to some embodiments.
Figure 2B:
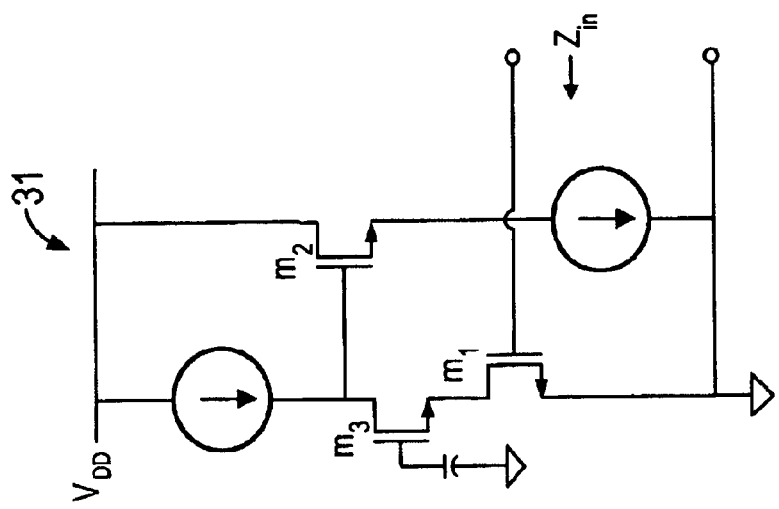
Figure 2A:
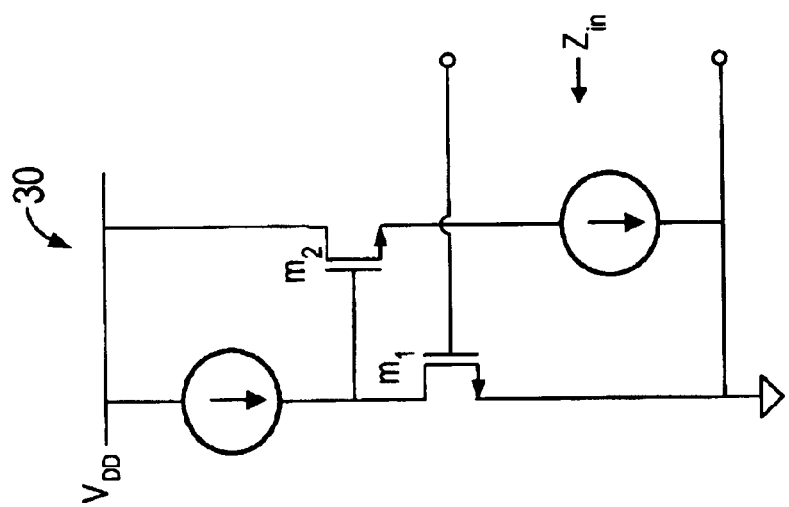

FIGS. 2a through 2c illustrate non-exclusive examples of active inductors that may be used in conjunction with some embodiments of the invention. In one specific arrangement, any of active inductors 30 through 32 may be substituted for one or both of active inductors 14 and 15 of limiting amplifier 1.

Active inductor 30 is a VHF integrated active inductor. Input impedance $Z_{in}$ of active inductor 30 is equal to $(g_{ds1}+j2\pi f(C_{gs2}+C_{gd1}+C_{gd2})/(g_{ds1}+g_{m1}+j2\pi fC_{gd2})(g_{m2}+j2\pi fC_{gs2}+C_{gd1})$. Inductor 31 of FIG. 2c represents a simple enhancement of inductor The input impedance of inductor 31 is given by by $[(g_{ds1}+j2\pi f(C_{gs2}+C_{gd1}+C_{gd2}))(g_{m3}+j2\pi fC_{gs2})]/[(\ g_{ds1}+g_{m1}+j2\pi fC_{gd2})(g_{m2}+j2\pi fC_{gd2}+C_{gd1})(g_{m1}+j2\pi fC_{gd3})]$. Active inductor 32, in turn, provides an input impedance $Z_{in}$ that is equal to $(1+j2\pi fC_{gs1}R)/(g_{m1}+j2\pi f[C_{gs1}-C_{gs2}+2\ \pi f^2 C_{gs2}(C_{gs1}C_{gs2}/g_{m1}g_{m2})])$.

Figure 3:
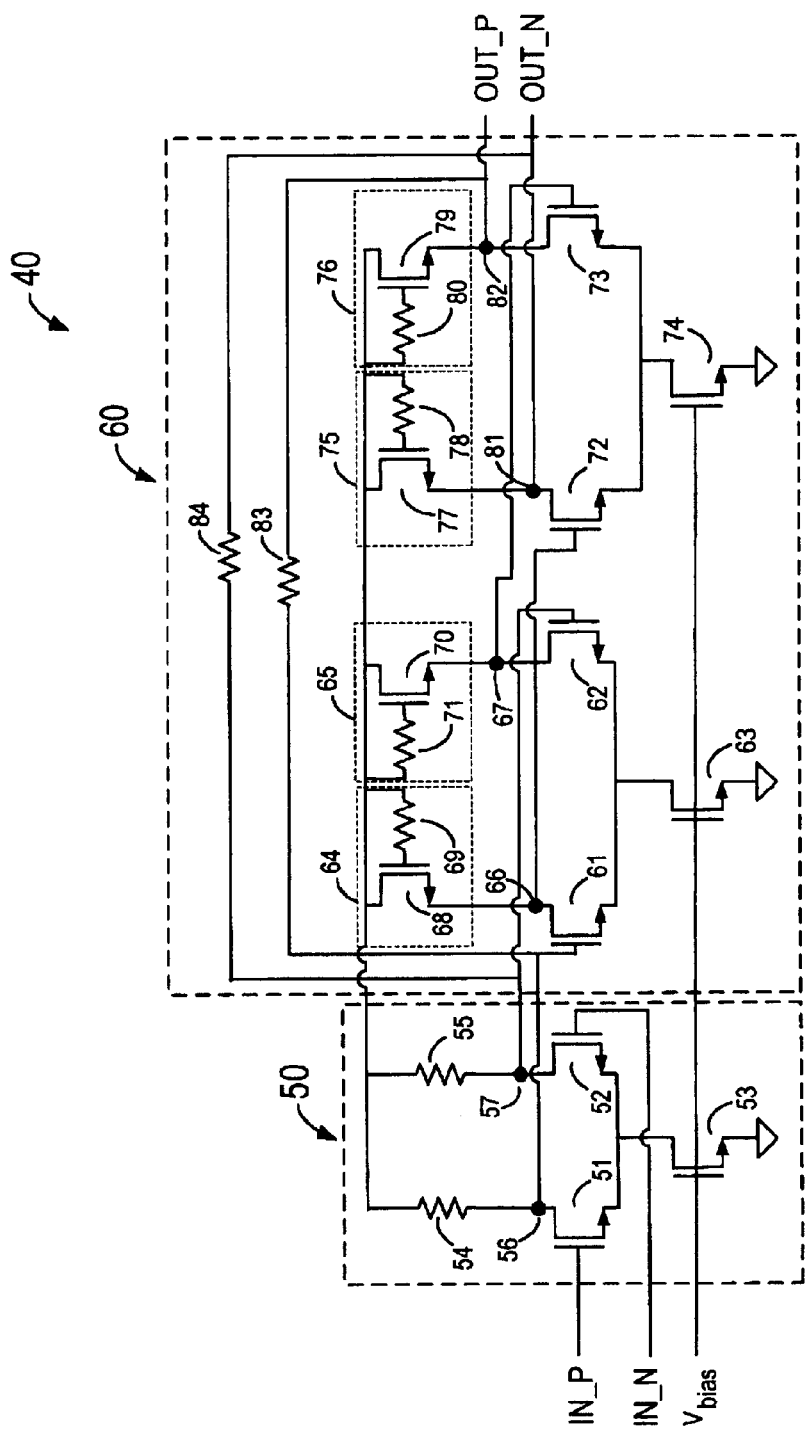
FIG. 3 is a diagram of a limiting amplifier according to some embodiments.

Any currently- or hereafter-known limiting amplifier may be used in conjunction with some embodiments. Amplifier 40 of FIG. 3 is one example of a limiting amplifier including an active inductor within a gain stage. Amplifier 40 consists of transconductance stage 50 and transimpedance stage 60, and is therefore considered a Cherry-Hooper type amplifier.

Transconductance stage 50 receives an input voltage and provides a slightly amplified output current to transimpedance stage 60. The input voltage is a differential signal carried by the signal lines labeled IN—P and IN—N. These lines are respectively coupled to the gates of NMOS transistors 51 and 52. Sources of transistors 51 and 52 are coupled together and to a drain of NMOS transistor 53. Transistor 53 functions as a current source to stage 50, with a source of transistor 53 coupled to ground and a gate thereof to receive bias voltage $V_{bias}$. Stage 50 is loaded by resistors 54 and 55 and the above-mentioned output current is provided at nodes 56 and 57.

Transimpedance stage 60 receives the output current and outputs an amplified voltage. As described above, the output voltage is limited to a particular value for any input signal within the operating range of amplifier 40. Transimpedance stage 60 comprises two stages, each of which is constructed similarly to amplifier 1 of FIG. 1a. In particular, elements 61 through 71 of a first stage and elements 72 through 82 of a second stage are coupled together as described with respect to respective elements 11 through 21 of amplifier 1. Output signals at output nodes 66 and 67 are provided to input terminals of the second stage, and output nodes 81 and 82 provide output signals of amplifier 40. In addition, each output signal is fed back to a respective input signal line of transimpedance stage 60 through one of resistors 83 and 84.

Figure 4:
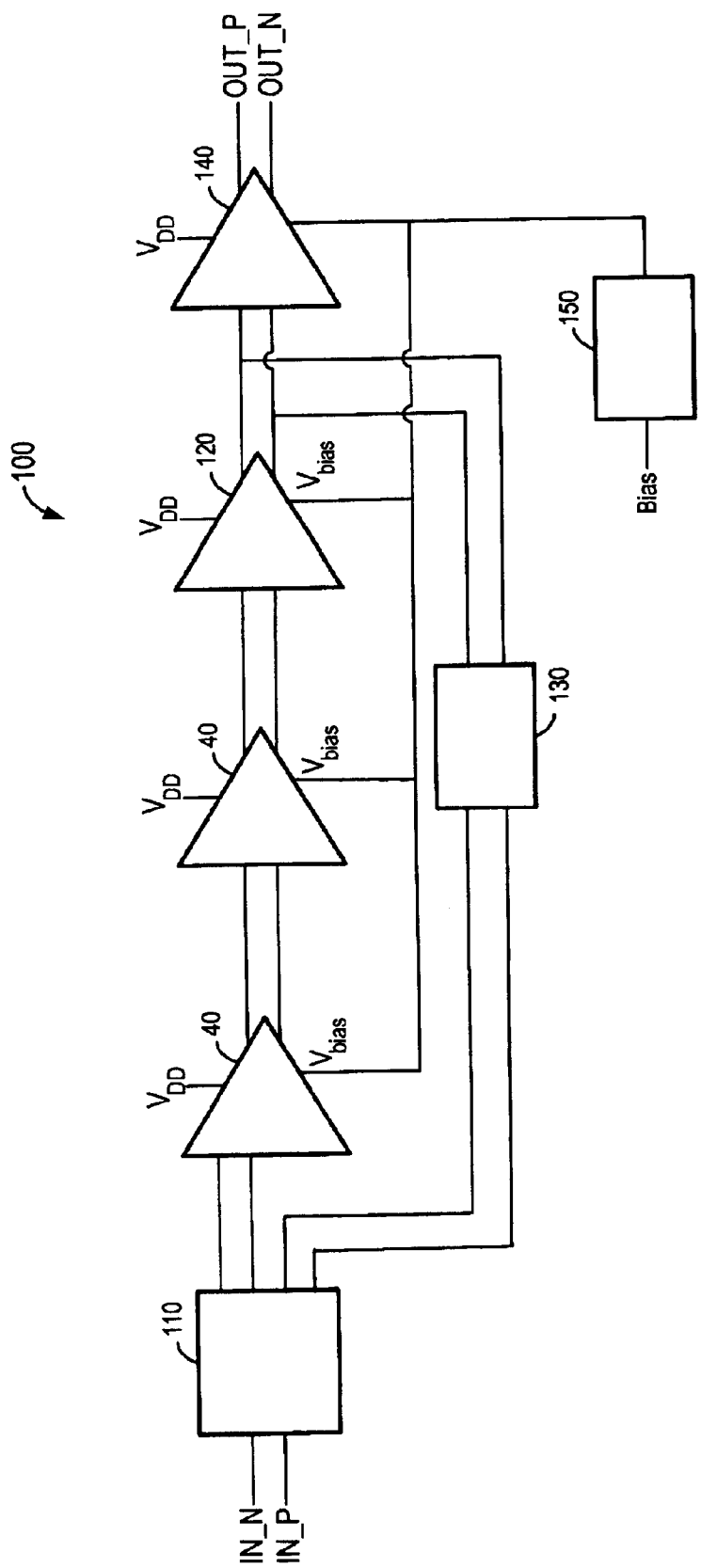
FIG. 4 is a diagram of a limiting amplifier according to some embodiments.

FIG. 4 illustrates limiting amplifier 100 according to some embodiments. Input stage 110 of amplifier 100 performs offset correction on a differential input signal that is represented by signals IN_P and IN_N. The corrected signal is amplified by two instances of amplifier 40 of FIG. 3 connected in series. Amplifier 120 further amplifies the amplified signal. Amplifier 120 is identical to amplifier 40 except that a resistor is substituted for each of active inductors 75 and 76. Such a configuration has been found to reduce jitter in some implementations.

Output buffer 140 is a unity gain amplifier that receives an output signal from amplifier 120 and outputs the output of amplifier 100 on the signal lines labeled OUT_P and OUT_N. Output buffer 140 sets the output impedance of amplifier 100 to a value required by its specification. Each amplifier of FIG. 4 receives a bias voltage from bias block 150. The bias voltage provided by bias block 150 is controlled by a Bias control signal.

Figure 5:
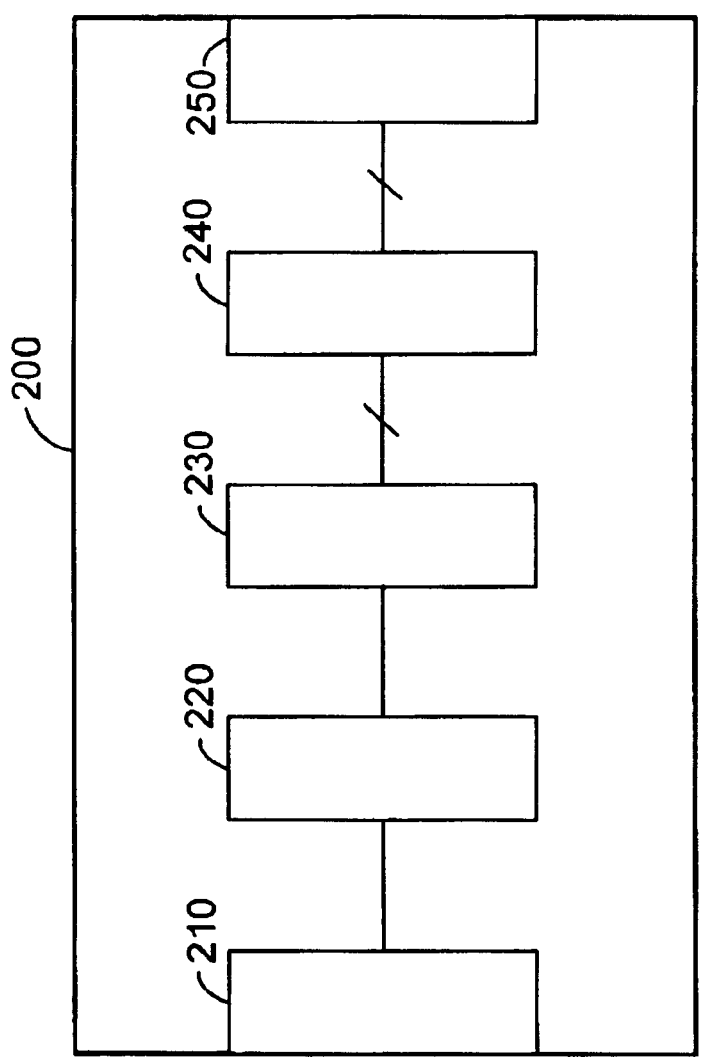
FIG. 5 is a diagram illustrating a module according to some embodiments.

The differential signal output from amplifier 120 is fed back to input stage 110 through low-pass filter 130. Low-pass filter 130 filters out components of the output signal having frequencies greater than 200 kHz. The remaining components of the output signal are used by input stage 110 to perform offset correction. FIG. 5 is a block diagram of a module according to some embodiments. Module 200 includes optical interface 210, also known as a transimpedance amplifier, for receiving optical signals via an optical medium coupled thereto. Limiting amplifier 220 is coupled to optical interface 210 and comprises a limiting amplifier with an active inductor load such as limiting amplifier 100. Module 200 also includes deserializer 230 for converting the amplified serial data clocked at a first speed and 16-bit parallel data clocked at a second, lower speed. The parallel data is transmitted to digital framer 240, which may be coupled to backplane interface 250 for communicating with a backplane (not shown). Module 200 may be an element of a line card used to transmit and receive data to and from an optical medium.

Some implementations of active inductors may be significantly smaller than passive inductors. Accordingly, some embodiments provide size advantages over conventional limiting amplifiers. Some embodiments may provide one or more of a gain function that is substantially invariant with process, and a gain-bandwidth product that cannot be efficiently achieved by conventional systems.

The several embodiments described herein are solely for the purpose of illustration. Embodiments may include any currently or hereafter-known current sources, transistors, amplifiers and/or active inductors. Therefore, persons skilled in the art will recognize from this description that other embodiments may be practiced with various modifications and alterations.

What is claimed is:

1. A circuit comprising:
    a transconductance stage to receive an input voltage and to generate an amplified output current; and
    a transimpedance stage comprising:
        a first limiting amplifier comprising a first gain stage and a first active inductor coupled to the first gain stage, the first limiting amplifier to receive the amplified output current and to output a first output signal; and
        a second limiting amplifier comprising a second gain stage and a second active inductor coupled to the second gain stage, the second limiting amplifier to receive the first output signal and to output an amplified voltage signal.

2. A circuit according to claim 1, wherein the first active inductor comprises:
    a transistor; and
    a resistor.

3. A circuit according to claim 2, wherein a drain of the transistor is coupled to a supply voltage, wherein a source of the transistor is coupled to an output node of the first limiting amplifier, wherein a first contact point of the resistor is coupled to the supply voltage, and wherein a second contact point of the resistor is coupled to a gate of the transistor.

4. A circuit according to claim 2, wherein a value of the resistor is to establish a zero approximately at a frequency at which the first active inductor begins to substantially exhibit inductive characteristics.

5. A circuit according to claim 1,
    wherein the circuit is to exhibit a zero approximately at a frequency at which the first active inductor begins to exhibit substantially inductive characteristics.

6. A module comprising:
    an optical interface to receive an optical signal, to convert the optical signal to an input voltage, and to transmit the input voltage;
    a transconductance stage to receive the input voltage and to generate an amplified output current; and a transimpedance stage comprising:
   a first limiting amplifier comprising a first gain stage and a first active inductor coupled to the first gain stage, the first limiting amplifier to receive the amplified output current and to output a first output signal; and
   a second limiting amplifier comprising a second gain stage and a second active inductor coupled to the second gain stage, the second limiting amplifier to receive the first output signal and to output an amplified voltage signal.

7. A module according to claim 6, further comprising:
a deserializer coupled to the second limiting amplifier; and
a framer coupled to the deserializer.

8. A module according to claim 6, wherein the first active inductor comprises:
a transistor; and
a resistor, and
wherein a drain of the transistor is coupled to a supply voltage, wherein a source of the transistor is coupled to an output node of the first limiting amplifier, wherein a first contact point of the resistor is coupled to the supply voltage, and wherein a second contact point of the resistor is coupled to a gate of the transistor.

9. A circuit according to claim 1, further comprising:
a second transconductance stage to receive the amplified voltage signal and to generate a second amplified output current; and a second transimpedance stage comprising:
   a third limiting amplifier comprising a third gain stage and a third active inductor coupled to the third gain stage, the third limiting amplifier to receive the second amplified output current and to output a second output signal; and
   a fourth limiting amplifier comprising a fourth gain stage and a fourth active inductor coupled to the fourth gain stage, the fourth limiting amplifier to receive the second output signal and to output a second amplified voltage signal.

10. A module according to claim 6, further comprising:
a second transconductance stage to receive the amplified voltage signal and to generate a second amplified output current; and
a second transimpedance stage comprising:
   a third limiting amplifier comprising a third gain stage and a third active inductor coupled to the third gain stage, the third limiting amplifier to receive the second amplified output current and to output a second output signal; and
a fourth limiting amplifier comprising a fourth gain stage and a fourth active inductor coupled to the fourth gain stage, the fourth limiting amplifier to receive the second output signal and to output a second amplified voltage signal.

* * * * *